United States Patent
Braun et al.

(10) Patent No.: US 11,774,550 B2
(45) Date of Patent: Oct. 3, 2023

(54) TWO-STATE AUTOMATIC GAIN CONTROL FOR COMMUNICATIONS AND RADAR

(71) Applicant: NOKIA TECHNOLOGIES OY, Espoo (FI)

(72) Inventors: Volker Braun, Stuttgart (DE); Shahriar Shahramian, Warren, NJ (US); Harish Viswanathan, Basking Ridge, NJ (US); Thorsten Wild, Stuttgart (DE)

(73) Assignee: NOKIA TECHNOLOGIES OY, Espoo (FI)

( * ) Notice: Subject to any disclaimer, the term of this patent is extended or adjusted under 35 U.S.C. 154(b) by 160 days.

(21) Appl. No.: 17/406,577

(22) Filed: Aug. 19, 2021

(65) Prior Publication Data

US 2022/0057478 A1 Feb. 24, 2022

(30) Foreign Application Priority Data

Aug. 20, 2020 (FI) ..................................... 20205811

(51) Int. Cl.
*G01S 7/34* (2006.01)
*H03G 3/30* (2006.01)

(52) U.S. Cl.
CPC .............. *G01S 7/34* (2013.01); *H03G 3/3021* (2013.01)

(58) Field of Classification Search
CPC ........ G01S 13/32; G01S 13/584; G01S 13/88; G01S 7/006; G01S 7/34; G01S 7/35; H03G 3/3021; H04L 5/0044; H04L 5/0048
See application file for complete search history.

(56) References Cited

U.S. PATENT DOCUMENTS

| | | | |
|---|---|---|---|
| 2003/0169706 A1* | 9/2003 | Poegel | H04B 7/0822 370/334 |
| 2006/0159058 A1* | 7/2006 | Johnson | H03G 3/3078 370/347 |
| 2018/0031673 A1 | 2/2018 | Kim et al. | |
| 2018/0348340 A1* | 12/2018 | Lien | G01S 7/352 |
| 2020/0182993 A1* | 6/2020 | Awazu | G01S 7/354 |
| 2021/0025968 A1* | 1/2021 | Lien | G01S 13/34 |

FOREIGN PATENT DOCUMENTS

WO 2012037680 A1 3/2012
WO 2018/222267 A1 12/2018

OTHER PUBLICATIONS

Extend European Search Report corresponding to EP Appln. No. 21191625.9, dated Mar. 14, 2022.
Petrov et al., "On Unified Vehicular Communications and Radar Sensing in Millimeter-Wave and Low Terahertz Bands", IEEE Wireless Communications, Coordinated Science Laboratory; Dept. Electrical and Computer Engineering, University of Illinois at Urbana-Champaign, US, vol. 26, No. 3, Jun. 1, 2019, XP011733785, pp. 146-153.

* cited by examiner

*Primary Examiner* — Timothy X Pham
(74) *Attorney, Agent, or Firm* — SQUIRE PATTON BOGGS (US) LLP

(57) ABSTRACT

Disclosed is a method and apparatus which use a first automatic gain control unit to receive a first data signal, use a second automatic gain control unit to receive a reflected radar signal, and switches between using the first automatic gain control unit and using the second automatic gain control unit.

20 Claims, 13 Drawing Sheets

1201 Transmit automatic gain control state information and/or antenna array partitioning state information

FIG. 12

1301 Receive automatic gain control state information and/or antenna array partitioning state information 1302 Switch between first AGC unit and second AGC unit based at least partly on the automatic gain control state information 1303 Use subarrays for transmitting or receiving based at least partly on the antenna array partitioning state information

FIG. 13

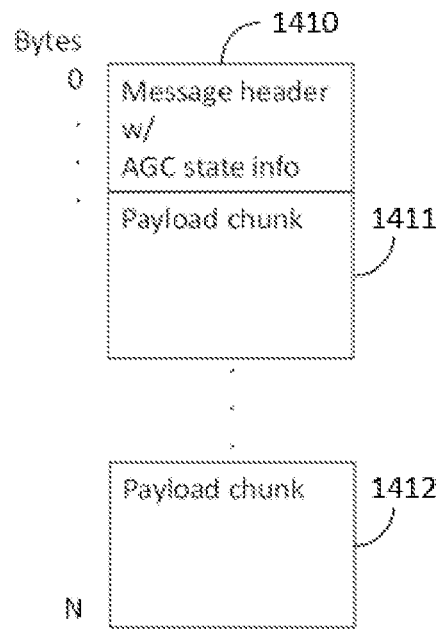

FIG. 14a

TWO-STATE AUTOMATIC GAIN CONTROL FOR COMMUNICATIONS AND RADAR

FIELD

The following exemplary embodiments relate to radars and to wireless communication.

BACKGROUND

In a joint radar and communication system, it is desirable to optimize the performance of the system.

SUMMARY

The scope of protection sought for various exemplary embodiments is set out by the independent claims. The exemplary embodiments and features, if any, described in this specification that do not fall under the scope of the independent claims are to be interpreted as examples useful for understanding various exemplary embodiments.

According to an aspect, there is provided an apparatus comprising at least one processor, and at least one memory including computer program code, wherein the at least one memory and the computer program code are configured, with the at least one processor, to cause the apparatus to: use a first automatic gain control unit to receive a first data signal; use a second automatic gain control unit to receive a reflected radar signal; and switch between using the first automatic gain control unit and using the second automatic gain control unit.

According to another aspect, there is provided an apparatus comprising means for: using a first automatic gain control unit to receive a first data signal; using a second automatic gain control unit to receive a reflected radar signal; and switching between using the first automatic gain control unit and using the second automatic gain control unit.

According to another aspect, there is provided a system configured to: use a first automatic gain control unit to receive a first data signal; use a second automatic gain control unit to receive a reflected radar signal; and switch between using the first automatic gain control unit and using the second automatic gain control unit.

According to another aspect, there is provided a system comprising means for: using a first automatic gain control unit to receive a first data signal; using a second automatic gain control unit to receive a reflected radar signal; and switching between using the first automatic gain control unit and using the second automatic gain control unit.

According to another aspect, there is provided a method comprising using a first automatic gain control unit to receive a first data signal; using a second automatic gain control unit to receive a reflected radar signal; and switching between using the first automatic gain control unit and using the second automatic gain control unit.

According to another aspect, there is provided a computer program comprising instructions for causing an apparatus to perform at least the following: use a first automatic gain control unit to receive a first data signal; use a second automatic gain control unit to receive a reflected radar signal; and switch between using the first automatic gain control unit and using the second automatic gain control unit.

According to another aspect, there is provided a computer readable medium comprising program instructions for causing an apparatus to perform at least the following: use a first automatic gain control unit to receive a first data signal; use a second automatic gain control unit to receive a reflected radar signal; and switch between using the first automatic gain control unit and using the second automatic gain control unit.

According to another aspect, there is provided a non-transitory computer readable medium comprising program instructions for causing an apparatus to perform at least the following: use a first automatic gain control unit to receive a first data signal; use a second automatic gain control unit to receive a reflected radar signal; and switch between using the first automatic gain control unit and using the second automatic gain control unit.

According to an aspect, there is provided an apparatus comprising at least one processor, and at least one memory including computer program code, wherein the at least one memory and the computer program code are configured, with the at least one processor, to cause the apparatus to: transmit automatic gain control state information and/or antenna array partitioning state information from a baseband unit to a radio frequency unit via an interface between the baseband unit and the radio frequency unit, wherein the automatic gain control state information indicates whether a received signal is used for radar or not, and/or a state change for switching between using a first automatic gain control unit and using a second automatic gain control unit, and wherein the antenna array partitioning state information indicates at least whether a first subarray is used for transmitting or receiving and whether a second subarray is used for transmitting or receiving.

According to another aspect, there is provided an apparatus comprising means for: transmitting automatic gain control state information and/or antenna array partitioning state information from a baseband unit to a radio frequency unit via an interface between the baseband unit and the radio frequency unit, wherein the automatic gain control state information indicates whether a received signal is used for radar or not, and/or a state change for switching between using a first automatic gain control unit and using a second automatic gain control unit, and wherein the antenna array partitioning state information indicates at least whether a first subarray is used for transmitting or receiving and whether a second subarray is used for transmitting or receiving.

According to another aspect, there is provided a method comprising transmitting automatic gain control state information and/or antenna array partitioning state information from a baseband unit to a radio frequency unit via an interface between the baseband unit and the radio frequency unit, wherein the automatic gain control state information indicates whether a received signal is used for radar or not, and/or a state change for switching between using a first automatic gain control unit and using a second automatic gain control unit, and wherein the antenna array partitioning state information indicates at least whether a first subarray is used for transmitting or receiving and whether a second subarray is used for transmitting or receiving.

According to another aspect, there is provided a computer program comprising instructions for causing an apparatus to perform at least the following: transmit automatic gain control state information and/or antenna array partitioning state information from a baseband unit to a radio frequency unit via an interface between the baseband unit and the radio frequency unit, wherein the automatic gain control state information indicates whether a received signal is used for radar or not, and/or a state change for switching between using a first automatic gain control unit and using a second automatic gain control unit, and wherein the antenna array partitioning state information indicates at least whether a first subarray is used for transmitting or receiving and whether a second subarray is used for transmitting or receiving.

According to another aspect, there is provided a computer readable medium comprising program instructions for causing an apparatus to perform at least the following: transmit automatic gain control state information and/or antenna array partitioning state information from a baseband unit to a radio frequency unit via an interface between the baseband unit and the radio frequency unit, wherein the automatic gain control state information indicates whether a received signal is used for radar or not, and/or a state change for switching between using a first automatic gain control unit and using a second automatic gain control unit, and wherein the antenna array partitioning state information indicates at least whether a first subarray is used for transmitting or receiving and whether a second subarray is used for transmitting or receiving.

According to another aspect, there is provided a non-transitory computer readable medium comprising program instructions for causing an apparatus to perform at least the following: transmit automatic gain control state information and/or antenna array partitioning state information from a baseband unit to a radio frequency unit via an interface between the baseband unit and the radio frequency unit, wherein the automatic gain control state information indicates whether a received signal is used for radar or not, and/or a state change for switching between using a first automatic gain control unit and using a second automatic gain control unit, and wherein the antenna array partitioning state information indicates at least whether a first subarray is used for transmitting or receiving and whether a second subarray is used for transmitting or receiving.

According to another aspect, there is provided a system comprising at least a radio frequency unit and a baseband unit, wherein the baseband unit is configured to: transmit automatic gain control state information and/or antenna array partitioning state information to the radio frequency unit via an interface between the baseband unit and the radio frequency unit, wherein the automatic gain control state information indicates whether a received signal is used for radar or not, and/or a state change for switching between using a first automatic gain control unit and using a second automatic gain control unit, and wherein the antenna array partitioning state information indicates at least whether a first subarray is used for transmitting or receiving and whether a second subarray is used for transmitting or receiving; and wherein the radio frequency unit is configured to: receive the automatic gain control state information and/or the antenna array partitioning state information from the baseband unit; use the first automatic gain control unit to receive a first data signal; switch between using the first automatic gain control unit and using the second automatic gain control unit based at least partly on the received automatic gain control state information; use the second automatic gain control unit to receive a reflected radar signal; and use the first subarray and the second subarray for transmitting or receiving based at least partly on the received antenna array partitioning state information, wherein the first subarray and the second subarray are comprised in an antenna array connected to the radio frequency unit.

According to another aspect, there is provided a system comprising at least a radio frequency unit and a baseband unit, wherein the baseband unit comprises means for transmitting automatic gain control state information and/or antenna array partitioning state information to the radio frequency unit via an interface between the baseband unit and the radio frequency unit, wherein the automatic gain control state information indicates whether a received signal is used for radar or not, and/or a state change for switching between using a first automatic gain control unit and using a second automatic gain control unit, and wherein the antenna array partitioning state information indicates at least whether a first subarray is used for transmitting or receiving and whether a second subarray is used for transmitting or receiving; and wherein the radio frequency unit comprises means for: receiving the automatic gain control state information and/or the antenna array partitioning state information from the baseband unit; using the first automatic gain control unit to receive a first data signal; switching between using the first automatic gain control unit and using the second automatic gain control unit based at least partly on the received automatic gain control state information; using the second automatic gain control unit to receive a reflected radar signal; and using the first subarray and the second subarray for transmitting or receiving based at least partly on the received antenna array partitioning state information, wherein the first subarray and the second subarray are comprised in an antenna array connected to the radio frequency unit.

According to an aspect, there is provided an apparatus comprising at least one processor, and at least one memory including computer program code, wherein the at least one memory and the computer program code are configured, with the at least one processor, to cause the apparatus to: determine a first beat frequency based at least partly on a first carrier frequency of a received reflected radar signal; determine a second beat frequency based at least partly on a second carrier frequency of the received reflected radar signal; and determine a velocity of a target based at least partly on the first beat frequency and the second beat frequency.

According to another aspect, there is provided an apparatus comprising means for: determining a first beat frequency based at least partly on a first carrier frequency of a received reflected radar signal; determining a second beat frequency based at least partly on a second carrier frequency of the received reflected radar signal; and determining a velocity of a target based at least partly on the first beat frequency and the second beat frequency.

According to another aspect, there is provided a method comprising determining a first beat frequency based at least partly on a first carrier frequency of a received reflected radar signal; determining a second beat frequency based at least partly on a second carrier frequency of the received reflected radar signal; and determining a velocity of a target based at least partly on the first beat frequency and the second beat frequency.

According to another aspect, there is provided a computer program comprising instructions for causing an apparatus to perform at least the following: determine a first beat frequency based at least partly on a first carrier frequency of a received reflected radar signal; determine a second beat frequency based at least partly on a second carrier frequency of the received reflected radar signal; and determine a velocity of a target based at least partly on the first beat frequency and the second beat frequency.

According to another aspect, there is provided a computer readable medium comprising program instructions for causing an apparatus to perform at least the following: determine a first beat frequency based at least partly on a first carrier frequency of a received reflected radar signal; determine a second beat frequency based at least partly on a second carrier frequency of the received reflected radar signal; and determine a velocity of a target based at least partly on the first beat frequency and the second beat frequency.

According to another aspect, there is provided a non-transitory computer readable medium comprising program instructions for causing an apparatus to perform at least the following: determine a first beat frequency based at least partly on a first carrier frequency of a received reflected radar signal; determine a second beat frequency based at least partly on a second carrier frequency of the received reflected radar signal; and determine a velocity of a target based at least partly on the first beat frequency and the second beat frequency.

BRIEF DESCRIPTION OF THE DRAWINGS

In the following, various exemplary embodiments will be described in greater detail with reference to the accompanying drawings, in which

FIGS. 11-13 illustrate flow charts according to some exemplary embodiments;

FIGS. 14a, 14b and 14c illustrate message formats according to some exemplary embodiments;

DETAILED DESCRIPTION

The following embodiments are exemplifying. Although the specification may refer to "an", "one", or "some" embodiment(s) in several locations of the text, this does not necessarily mean that each reference is made to the same embodiment(s), or that a particular feature only applies to a single embodiment. Single features of different embodiments may also be combined to provide other embodiments.

In the following, different exemplary embodiments will be described using, as an example of an access architecture to which the exemplary embodiments may be applied, a radio access architecture based on long term evolution advanced (LTE Advanced, LTE-A) or new radio (NR, 5G), without restricting the exemplary embodiments to such an architecture, however. It is obvious for a person skilled in the art that the exemplary embodiments may also be applied to other kinds of communications networks having suitable means by adjusting parameters and procedures appropriately. Some examples of other options for suitable systems may be the universal mobile telecommunications system (UMTS) radio access network (UTRAN or E-UTRAN), long term evolution (LTE, the same as E-UTRA), wireless local area network (WLAN or Wi-Fi), worldwide interoperability for microwave access (WiMAX), Bluetooth®, personal communications services (PCS), ZigBee®, wideband code division multiple access (WCDMA), systems using ultra-wideband (UWB) technology, sensor networks, mobile ad-hoc networks (MANETs) and Internet Protocol multimedia subsystems (IMS) or any combination thereof.

Figure 1:
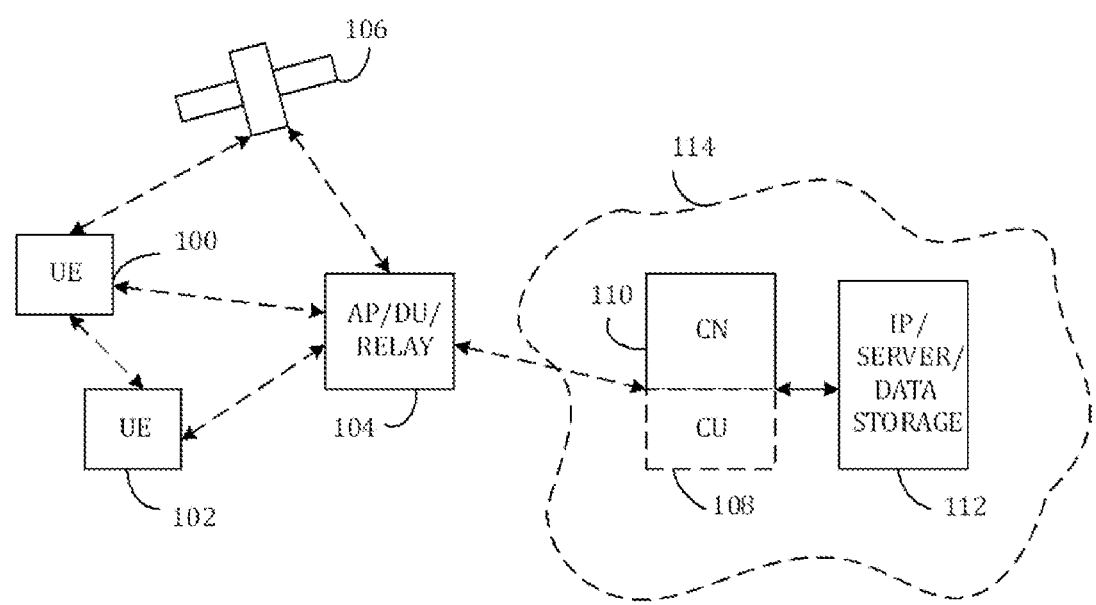
FIG. 1 illustrates an exemplary embodiment of a cellular communication network.

FIG. 1 depicts examples of simplified system architectures showing some elements and functional entities, all being logical units, whose implementation may differ from what is shown. The connections shown in FIG. 1 are logical connections; the actual physical connections may be different. It is apparent to a person skilled in the art that the system may also comprise other functions and structures than those shown in FIG. 1.

The exemplary embodiments are not, however, restricted to the system given as an example but a person skilled in the art may apply the solution to other communication systems provided with necessary properties.

The example of FIG. 1 shows a part of an exemplifying radio access network.

FIG. 1 shows user devices 100 and 102 configured to be in a wireless connection on one or more communication channels in a cell with an access node (such as (e/g)NodeB) 104 providing the cell. The physical link from a user device to a (e/g)NodeB may be called uplink or reverse link and the physical link from the (e/g)NodeB to the user device may be called downlink or forward link. It should be appreciated that (e/g)NodeBs or their functionalities may be implemented by using any node, host, server or access point etc. entity suitable for such a usage.

A communication system may comprise more than one (e/g)NodeB, in which case the (e/g)NodeBs may also be configured to communicate with one another over links, wired or wireless, designed for the purpose. These links may be used for signaling purposes. The (e/g)NodeB may be a computing device configured to control the radio resources of communication system it is coupled to. The NodeB may also be referred to as a base station, an access point or any other type of interfacing device including a relay station capable of operating in a wireless environment. The (e/g)NodeB may include or be coupled to transceivers. From the transceivers of the (e/g)NodeB, a connection may be provided to an antenna unit that establishes bi-directional radio links to user devices. The antenna unit may comprise a plurality of antennas or antenna elements. The (e/g)NodeB may further be connected to core network 110 (CN or next generation core NGC). Depending on the system, the counterpart on the CN side may be a serving gateway (S-GW, routing and forwarding user data packets), packet data network gateway (P-GW), for providing connectivity of user devices (UEs) to external packet data networks, or mobile management entity (MME), etc.

The user device (also called UE, user equipment, user terminal, terminal device, etc.) illustrates one type of an apparatus to which resources on the air interface may be allocated and assigned, and thus any feature described herein with a user device may be implemented with a corresponding apparatus, such as a relay node. An example of such a relay node may be a layer 3 relay (self-backhauling relay) towards the base station.

The user device may refer to a portable computing device that includes wireless mobile communication devices operating with or without a subscriber identification module (SIM), including, but not limited to, the following types of devices: a mobile station (mobile phone), smartphone, personal digital assistant (PDA), handset, device using a wireless modem (alarm or measurement device, etc.), laptop and/or touch screen computer, tablet, game console, notebook, and multimedia device. It should be appreciated that a user device may also be a nearly exclusive uplink only device, of which an example may be a camera or video camera loading images or video clips to a network. A user device may also be a device having capability to operate in Internet of Things (IoT) network which is a scenario in which objects may be provided with the ability to transfer data over a network without requiring human-to-human or human-to-computer interaction. The user device may also utilize cloud. In some applications, a user device may comprise a small portable device with radio parts (such as a watch, earphones or eyeglasses) and the computation may be carried out in the cloud. The user device (or in some exemplary embodiments a layer 3 relay node) may be configured to perform one or more of user equipment functionalities. The user device may also be called a subscriber unit, mobile station, remote terminal, access terminal, user terminal, terminal device, or user equipment (UE) just to mention but a few names or apparatuses.

Various techniques described herein may also be applied to a cyber-physical system (CPS) (a system of collaborating computational elements controlling physical entities). CPS may enable the implementation and exploitation of massive amounts of interconnected ICT devices (sensors, actuators, processors microcontrollers, etc.) embedded in physical objects at different locations. Mobile cyber physical systems, in which the physical system in question may have inherent mobility, are a subcategory of cyber-physical systems. Examples of mobile physical systems include mobile robotics and electronics transported by humans or animals.

Additionally, although the apparatuses have been depicted as single entities, different units, processors and/or memory units (not all shown in FIG. 1) may be implemented.

5G may enable using multiple input—multiple output (MIMO) antennas, many more base stations or nodes than the LTE (a so-called small cell concept), including macro sites operating in co-operation with smaller stations and employing a variety of radio technologies depending on service needs, use cases and/or spectrum available. 5G mobile communications may support a wide range of use cases and related applications including video streaming, augmented reality, different ways of data sharing and various forms of machine type applications (such as (massive) machine-type communications (mMTC), including vehicular safety, different sensors and real-time control. 5G may be expected to have multiple radio interfaces, namely below 6 GHz, cmWave and mmWave, and also being integradable with existing legacy radio access technologies, such as the LTE. Integration with the LTE may be implemented, at least in the early phase, as a system, where macro coverage may be provided by the LTE, and 5G radio interface access may come from small cells by aggregation to the LTE. In other words, 5G may support both inter-RAT operability (such as LTE-5G) and inter-RI operability (inter-radio interface operability, such as below 6 GHz-cmWave, below 6 GHz-cmWave-mmWave). One of the concepts considered to be used in 5G networks may be network slicing in which multiple independent and dedicated virtual sub-networks (network instances) may be created within the same infrastructure to run services that have different requirements on latency, reliability, throughput and mobility.

The current architecture in LTE networks may be fully distributed in the radio and fully centralized in the core network. The low latency applications and services in 5G may require to bring the content close to the radio which leads to local break out and multi-access edge computing (MEC). 5G may enable analytics and knowledge generation to occur at the source of the data. This approach may require leveraging resources that may not be continuously connected to a network such as laptops, smartphones, tablets and sensors. MEC may provide a distributed computing environment for application and service hosting. It may also have the ability to store and process content in close proximity to cellular subscribers for faster response time. Edge computing may cover a wide range of technologies such as wireless sensor networks, mobile data acquisition, mobile signature analysis, cooperative distributed peer-to-peer ad hoc networking and processing also classifiable as local cloud/fog computing and grid/mesh computing, dew computing, mobile edge computing, cloudlet, distributed data storage and retrieval, autonomic self-healing networks, remote cloud services, augmented and virtual reality, data caching, Internet of Things (massive connectivity and/or latency critical), critical communications (autonomous vehicles, traffic safety, real-time analytics, time-critical control, healthcare applications).

The communication system may also be able to communicate with other networks, such as a public switched telephone network or the Internet 112, or utilize services provided by them. The communication network may also be able to support the usage of cloud services, for example at least part of core network operations may be carried out as a cloud service (this is depicted in FIG. 1 by "cloud" 114). The communication system may also comprise a central control entity, or a like, providing facilities for networks of different operators to cooperate for example in spectrum sharing.

Edge cloud may be brought into radio access network (RAN) by utilizing network function virtualization (NVF) and software defined networking (SDN). Using edge cloud may mean access node operations to be carried out, at least partly, in a server, host or node operationally coupled to a remote radio head or base station comprising radio parts. It may also be possible that node operations will be distributed among a plurality of servers, nodes or hosts. Application of cloudRAN architecture may enable RAN real time functions being carried out at the RAN side (in a distributed unit, DU 104) and non-real time functions being carried out in a centralized manner (in a centralized unit, CU 108).

It should also be understood that the distribution of labour between core network operations and base station operations may differ from that of the LTE or even be non-existent. Some other technology advancements that may be used may be Big Data and all-IP, which may change the way networks are being constructed and managed. 5G (or new radio, NR) networks may be designed to support multiple hierarchies, where MEC servers may be placed between the core and the base station or nodeB (gNB). It should be appreciated that MEC may be applied in 4G networks as well.

5G may also utilize satellite communication to enhance or complement the coverage of 5G service, for example by providing backhauling. Possible use cases may be providing service continuity for machine-to-machine (M2M) or Internet of Things (IoT) devices or for passengers on board of vehicles, or ensuring service availability for critical communications, and future railway/maritime/aeronautical communications. Satellite communication may utilize geostationary earth orbit (GEO) satellite systems, but also low earth orbit (LEO) satellite systems, in particular mega-constellations (systems in which hundreds of (nano) satellites are deployed). Each satellite 106 in the mega-constellation may cover several satellite-enabled network entities that create on-ground cells. The on-ground cells may be created through an on-ground relay node 104 or by a gNB located on-ground or in a satellite.

It is obvious for a person skilled in the art that the depicted system is only an example of a part of a radio access system and in practice, the system may comprise a plurality of (e/g)NodeBs, the user device may have an access to a plurality of radio cells and the system may also comprise other apparatuses, such as physical layer relay nodes or other network elements, etc. At least one of the (e/g)NodeBs or may be a Home(e/g) nodeB. Additionally, in a geographical area of a radio communication system, a plurality of different kinds of radio cells as well as a plurality of radio cells may be provided. Radio cells may be macro cells (or umbrella cells) which may be large cells having a diameter of up to tens of kilometers, or smaller cells such as micro-, femto- or picocells. The (e/g)NodeBs of FIG. 1 may provide any kind of these cells. A cellular radio system may be implemented as a multilayer network including several kinds of cells. In multilayer networks, one access node may provide one kind of a cell or cells, and thus a plurality of (e/g)NodeBs may be required to provide such a network structure.

For fulfilling the need for improving the deployment and performance of communication systems, the concept of "plug-and-play" (e/g)NodeBs may be introduced. A network which may be able to use "plug-and-play" (e/g) Node Bs, may include, in addition to Home (e/g)NodeBs (H(e/g) nodeBs), a home node B gateway, or HNB-GW (not shown in FIG. 1). A HNB Gateway (HNB-GW), which may be installed within an operator's network, may aggregate traffic from a large number of HNBs back to a core network.

Radio detection and ranging, i.e. radar, may be used for example in LTE, NR, beyond 5G, or 6G wireless communication systems. As an example, a mobile radio base station may be used for exchanging data with mobile users, as well as for pedestrian and/or vehicular traffic monitoring when deployed along roads, for example within cities or at highway bridges. The transmit signal of the radar system may be reflected by a target, such as a human or a car, and by processing the received signal it may be possible to derive properties such as distance, horizontal and/or vertical direction, velocity and/or size of target(s) present in the vicinity of the radio base station.

The radio head, i.e. the radio frequency, RF, unit of the radio base station, may be configured as a true hyperspectral node for communication as well as radar, imaging, etc. The radio head may operate at several frequencies at the same time in licensed as well as unlicensed frequency bands. The radio head may also be equipped with other types of imaging devices, such as cameras, for example infrared and/or visible, and the information from these sensory inputs may be combined with radar measurement results for example from millimeter wave (mmWave), or THz components. Machine learning, deep learning and/or artificial intelligence, AI, algorithms may be applied for analysis of measurement results from the sensors and radio head RF devices.

Radio heads may be implemented with a combination of licensed and unlicensed frequency bands simultaneously. Such radio heads may offer several advantages for communication. For example, it may allow for simultaneous links at different frequencies, carrier aggregation, and a mix of self-backhaul and user links. The multi-band nature of the radio head may also allow for radar, imaging and sensing to be done across several frequencies as well. The information from various frequency bands may be combined to refine the measurements, offer disambiguation, or cover the field-of-view of the radio head quicker, for example by partitioning the field-of-view into multiple subspaces and by beamforming each subspace using a different frequency.

Multi-band radio heads may therefore serve multiple users across frequencies, as well as perform radar, imaging and/or sensing at multiple frequencies or any combination at the same time. Aside from radar applications, spectroscopy-type analysis may also be performed by the radio head. This may be of interest for example in the case where the radio head is multi-band. The variation between the received signal across frequencies from the radio head may reveal the differences between the material compositions and/or object shapes in the field-of-view of the radio head. It should be noted that the field-of-view of the radio head may not necessarily imply line-of-sight. The radar/communication hybrid radio head may offer security applications as well as aid in monitoring traffic flow, speed, people-presence, movement direction, weapon detection, etc., while simultaneously performing communication tasks.

Short range radar systems may apply frequency modulated continuous wave, FMCW, signals, for example chirp signals, due to favourable system implications, such as a low peak to average power ratio, PAPR. Chirp signals may be embedded into the air interface of the communication system for example by time division multiplex, TDM. However, a disadvantage with constant envelope modulation may be that the excitation signals do not carry data, and therefore the overhead for sensing may reduce the capacity for data.

For example, an orthogonal frequency division multiplex, OFDM, radar may be used to enable joint communication and sensing. With an OFDM radar, the downlink, DL, signal carrying actual data, i.e. the OFDM resource elements carrying quadrature amplitude modulation, QAM, symbols, may be used as the excitation signal, and thus there may be no need to reduce DL capacity for sensing.

Short range radar systems may require simultaneous transmission of the radar excitation signals and reception of the reflected radar excitation signals, since the echo may come back very quickly, for example within a cyclic prefix in OFDM. This may be implemented for example by using a full duplex transceiver, by using antenna separation, or by a combination of both. However, a full duplex transceiver for an OFDM radar may be more complex to implement than for an FMCW radar.

Time-division duplexing, TDD, may be used for the wireless communications part of the system. In TDD, transmission and reception of data may be switched in the time domain, i.e. transmission and reception occur at different time instants, and the received signals for data and radar may use the same carrier frequency, or substantially the same carrier frequency.

The signal processing for an OFDM radar may be based on a two-dimensional Fourier transform to compute a periodogram with N columns and M rows, where N denotes the number of sub-carriers, and M denotes the number of OFDM symbols carrying the excitation signals. In the obtained periodogram, the maximum position column-wise may relate to the distance of the target, i.e. the delay of the echo signal, and row-wise to the target velocity, i.e. the Doppler shift of the echo signal. The periodogram may benefit from an improvement of the signal-to-noise ratio, SNR, by a factor of N times M versus the SNR at the receive antenna, which may be called the processing gain. The signal processing for an FMCW radar may be also based on a two-dimensional Fourier transform, with the difference that the maximum position column-wise may relate to both distance and velocity of the target.

Radar excitation signals having a time domain comb structure may be suitable for example for embedding into the air interface of a wireless communication system. Time domain comb signals may avoid excessive blocking of the communication air interface, and they may consume less overhead than the time-contiguous signals that may be used in short range radar systems.

Figure 2A:
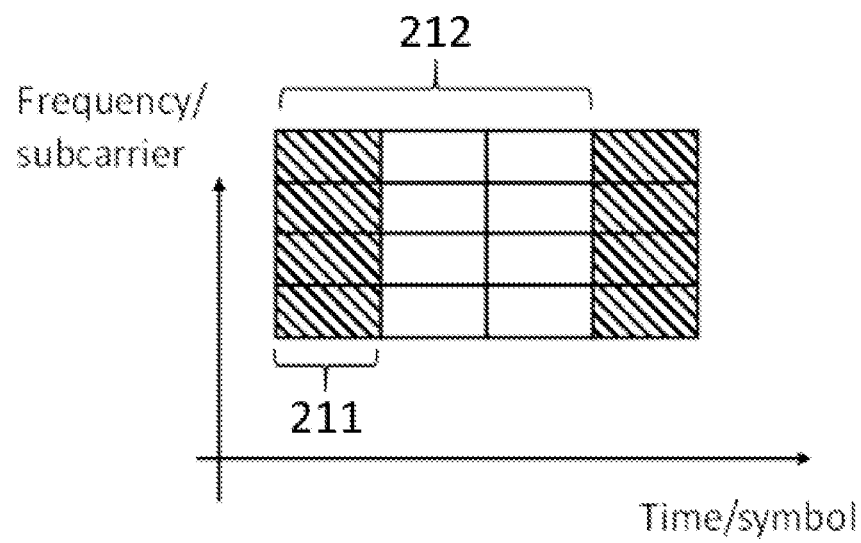
FIG. 2a illustrates an OFDM-based comb signal.

FIG. 2a illustrates an OFDM-based comb signal. An OFDM-based air interface may comprise a total OFDM symbol duration 211 denoted by $T_0$, including cyclic prefix. An OFDM-based time domain comb signal may be defined by the sampling period 212, denoted as $mT_0$, with integer m>1, i.e. the time domain spacing between two consecutive symbols of the comb signal, as well as by the number of symbols M of the signal.

Figure 2B:
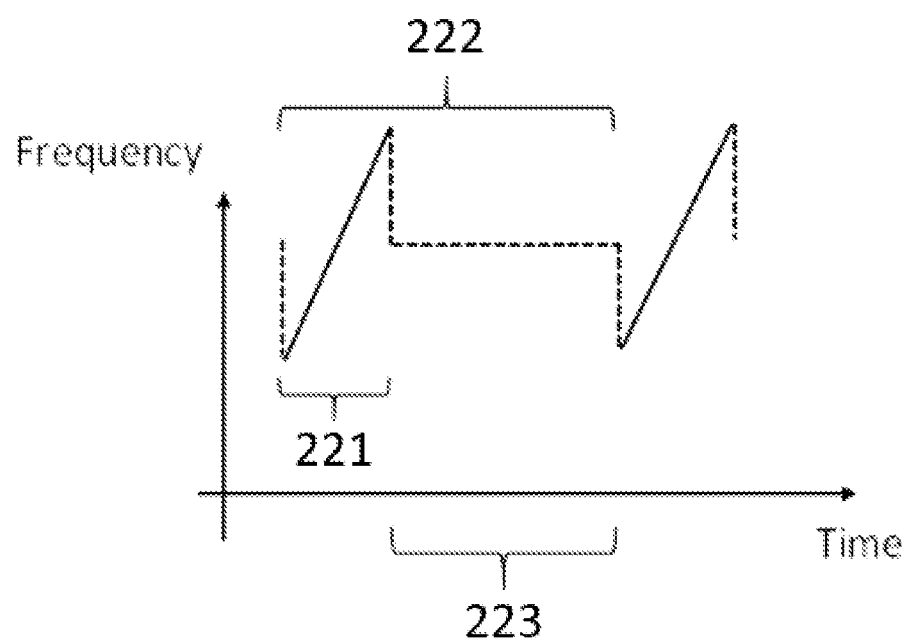
FIG. 2b illustrates a chirp-based comb signal.

FIG. 2b illustrates a chirp-based comb signal. For embedding a chirp-based time domain comb signal, the duration 221 of a single chirp, denoted as $T_c$, may be dimensioned according to $T_c=T_0$, and the sampling period 222 may be defined by $mT_c$. The burst duration of the time domain comb signal may be defined as $mMT_0$. The interval 223 indicates the time period when the chirp is switched off.

The dimensioning of the integer parameters m and M of the time domain comb signals is to ensure sufficiently large maximum unambiguous velocity given by $c/(2 f_c mT_0)$, i.e. inversely proportional to the sampling period, and sufficiently fine velocity resolution given by $c/(2 f_c mMT_0)$, i.e. inversely proportional to burst duration, where c denotes the velocity of light and $f_c$ denotes the carrier frequency.

Figure 3:
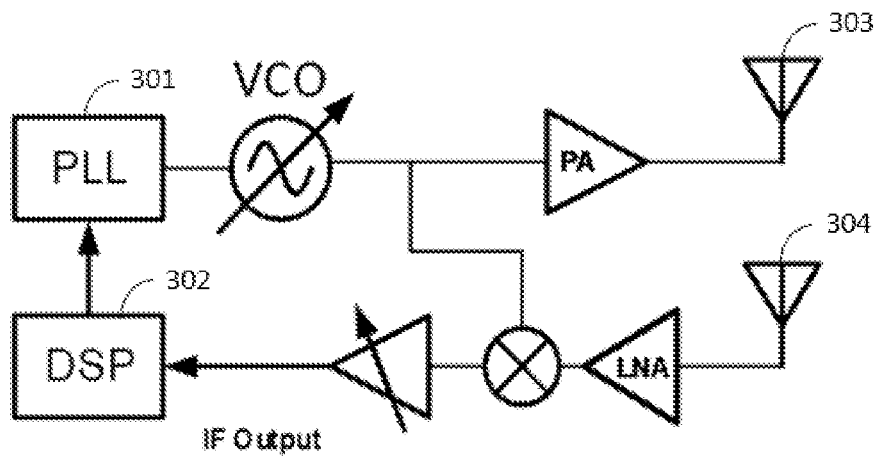
FIG. 3 illustrates a simplified architecture of a radar apparatus.

FIG. 3 illustrates a simplified architecture of a radar apparatus. The apparatus comprises a phase locked loop 301, PLL, a digital signal processor 302, DSP, one or more power amplifiers, PA, one or more low noise amplifiers, LNA, two or more antennas 303, 304, one or more frequency mixers, and a voltage controlled oscillator, VCO. The PLL may be used to generate an RF signal to be transmitted. In an FMCW radar, the PLL may be used to create a triangular-shape frequency sweep. The transmit, TX, and receive, RX, antennas may be separate or co-integrated. The received signal in an FMCW radar may be mixed with the same RF transmitter signal to generate an intermediate frequency, IF, signal. A digital signal processor, DSP, comprising one or more analog-to-digital converters, ADC, may be used to analyze the resulting IF signal and extract various radar signatures from the spectral information. It should be noted that many of the same building blocks used in the radar may also be used in a communication system. Furthermore, the radar may have several antennas, and it may operate as a beamformer or synthetic aperture.

Figure 4:
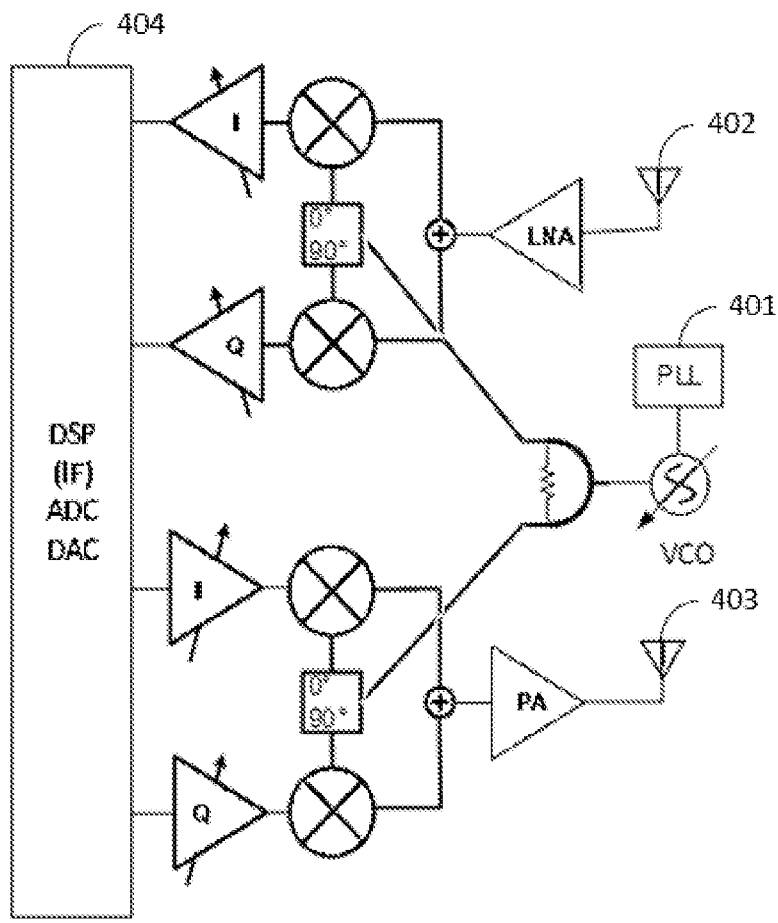
FIG. 4 illustrates a dual-purpose I/Q transceiver for sensing and communication.

FIG. 4 illustrates a dual-purpose I/Q transceiver for sensing and communication. The transceiver comprises a PLL 401 to support FMCW radar. The transceiver may be implemented with direct-conversion architecture, or it may be implemented as heterodyne. Although the architecture illustrated in FIG. 4 comprises a single TX antenna 403 and an RX antenna 402, the implementation may use phased arrays of any configuration, such as local oscillator, LO, RF, IF or digital beamforming. The DSP block 404 may be used for example for ADC, DAC, waveform generation, error correction, equalization, etc. Furthermore, in a multi-band system, several PLLs may be used to generate various carrier frequencies. The transceiver may also be used to generate an FMCW signal for a radar by two means: 1) the IF frequency sweep may be used and up-converted by a constant LO to generate FMCW at RF, or 2) the PLL may be used to sweep the LO signal with a fixed IF to generate FMCW at RF. In addition to simple FMCW, pulse, etc. radar waveforms, the transceiver architecture may also create more advanced radar waveforms by using the ADCs and/or DACs built into the DSP. This feature may be used for more complex imaging scenarios. As discussed previously, beamforming phased array modules may use TDD for communications, which may not be the mode of operation in radar. However, the array may be designed such that various sub-sections may operate simultaneously in RX/TX mode for radar operation. Two separate array apertures may also be used in conjunction to perform radar operations. The DSP blocks used in communication and radar may share similarities. Therefore, a single DSP may be shared to perform both radar and communication tasks.

Another component of the receiver may be an automatic gain control, AGC, unit. AGC is a closed-loop feedback regulating circuit in an amplifier or chain of amplifiers, which may be used to maintain a suitable, or constant, signal amplitude at its output, despite variation of the signal amplitude at the input. The average or peak output signal level may be used to dynamically adjust the gain of the amplifier(s), enabling the circuit to work satisfactorily with a greater range of input signal levels. AGCs may be used in radio receivers for example to equalize the average volume, i.e. loudness, of different radio stations due to differences in received signal strength, as well as variations in a single station's radio signal due to fading.

When designing an AGC loop, the response time may be considered. If the loop responds too quickly, it may create undesired gain modulation arising from the loop's efforts to stabilize the output level of a signal containing legitimate amplitude modulation. AGC response times to input amplitude steps may be in the order of, for example, 3 seconds for small amplitude steps and 5-10 seconds for large amplitude steps. Such periods may relate to hundreds of radio frames, i.e. tens of thousands of time domain symbols.

The uplink, UL, communication signals transmitted by UEs may be power controlled to at least partly compensate the path loss. This may cause the UL signals of different users to be received at the base station antenna port within a rather narrow power range. The receive power of reflected radar signals, on the other hand, may depend on the presence of clutter, for example buildings in urban environments, and the size of the actual targets. This may imply that the received signal power of UL communications signals and reflected radar signals may be different. The radar receive signals may be much weaker in received signal strength than the communication signals.

When using an AGC, low pass filtering, or averaging, over both communication and radar signals may be applied to determine the AGC output level. If radar signals occur sparsely, as with the above time-domain comb signals, the AGC output may predominantly be adapted to the communication system. In this case, the received radar signal at the AGC output may be very weak in received signal strength, which may result in a very coarse resolution after analog-to-digital conversion, ADC. In turn, this may lead to inaccurate determination of target properties.

The quantization noise after ADC may depend on the number of bits used for quantization and the supported dynamic range as well. Joint radar and communication systems may be attractive for example for higher carrier frequencies, such as mmWave, sub-THz or THz, due to the high available signal bandwidth providing accurate range resolution. In addition, the small wavelengths may allow a large number of antenna elements and thus a large relative antenna aperture with high directivity gains. Under high carrier frequencies, the number of practically available bits for ADC resolution may be limited due to, for example, energy consumption growing approximately quadratic with the bandwidth.

Some exemplary embodiments may provide an AGC solution which jointly supports communication and radar without leading to a coarse resolution or infeasible dynamic range. Thus, some exemplary embodiments may be used to improve receiver performance of the radar and communication system parts while they share the air interface resources in time multiplex.

Figure 5:
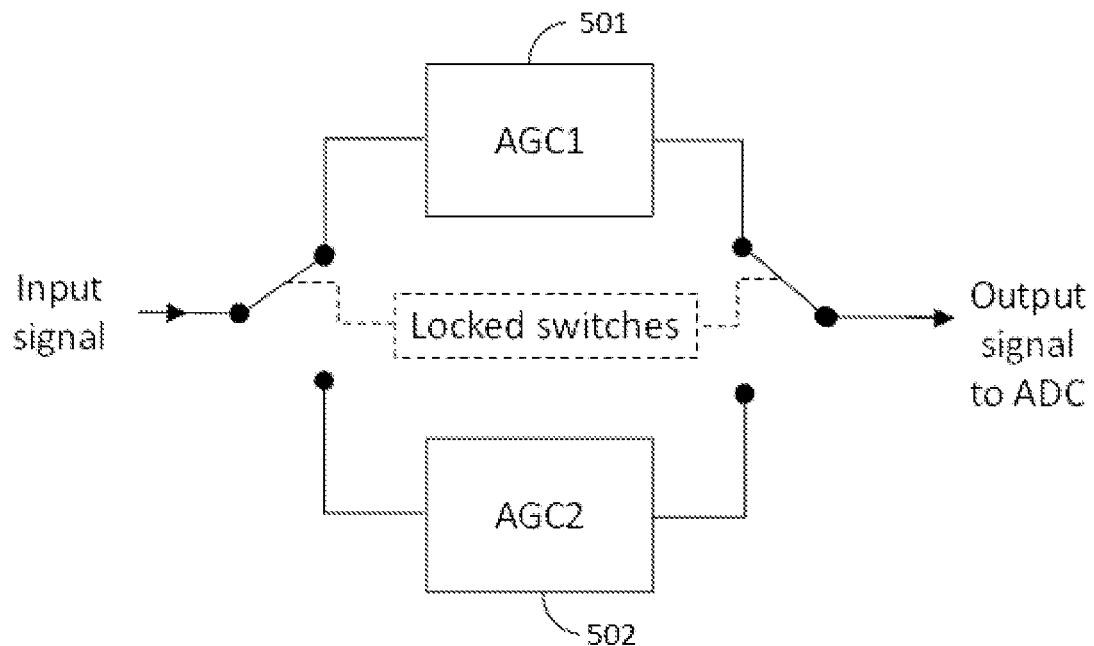
FIG. 5 illustrates a schematic circuit design for a two-state AGC according to an exemplary embodiment.

FIG. 5 illustrates a schematic circuit design for a two-state AGC according to an exemplary embodiment. In this exemplary embodiment, two separate AGC processes may be applied in the RF processing unit: one for communication and one for radar. The different AGC processes may be implemented by means of separate hardware instances or by using different states of the same hardware instance. The input signal may be before or after down-mixing. In the former case, separate down-mixers may be included prior to the respective AGCs. For example, with FMCW radar, there may be a first down-mixer plus AGC for the FMCW signal, and a second down-mixer plus AGC for the communication signal, for example OFDM signal. If communication and radar both use OFDM, there may be a common down-mixer but different AGCs. Data reception may use a first AGC unit 501, while during the time-domain symbols used for transmission of radar excitation signals, a second AGC unit 502 may be used to receive the reflected radar signal.

Figure 6:
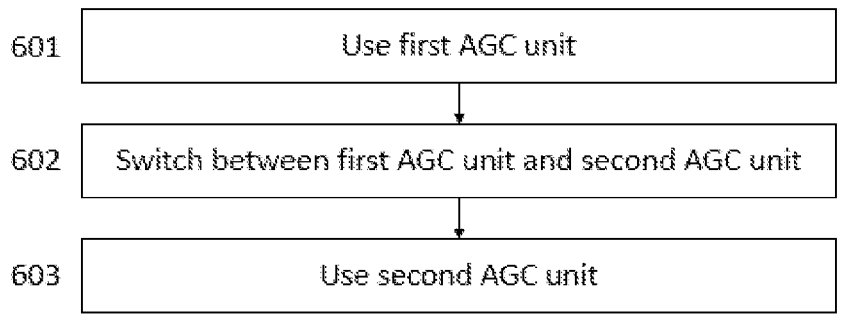
FIGS. 6 and 7 illustrate flow charts according to some exemplary embodiments.

FIG. 6 illustrates a flow chart according to an exemplary embodiment, wherein an apparatus such as a base station, or an RF unit comprised in a base station, may switch between using a first AGC unit adapted for receiving data signals, i.e. communication signals, and using a second AGC unit adapted for receiving reflected radar signals. As described previously, received radar signals may be much weaker in received signal strength than received communication signals. Thus, the second AGC unit may be configured to provide more amplification to weak signals, such as the received reflected radar signal, than the first AGC unit. The exemplary embodiment illustrated in FIG. 6 may use, for example, the two-state AGC illustrated in FIG. 5.

Referring to FIG. 6, the first AGC unit is used 601 to receive a first data signal. In other words, the first AGC unit may be used to adjust a first amplifier gain for the first data signal received in a radio receiver. The first data signal may be received via an antenna, or an antenna array, connected to the first AGC unit while receiving the first data signal. The first data signal may be received for example from a UE, i.e. a terminal device. The apparatus switches 602 between using the first AGC unit and using the second AGC unit. For example, the apparatus may switch from the first AGC unit to the second AGC unit, or from the second AGC unit to the first AGC unit. The second AGC unit is used 603 to receive the reflected radar signal. In other words, the second AGC unit may be used to adjust a second amplifier gain for the reflected radar signal received in the radio receiver. The reflected radar signal may be received via the antenna, or antenna array, connected to the second AGC unit while receiving the reflected radar signal. The antenna connected to the second AGC unit while receiving the reflected radar signal may be the same antenna as the antenna connected to the first AGC unit while receiving the first data signal, wherein the connection between the antenna and the AGC units may be controlled by the switch. In other words, the first AGC unit and the second AGC unit may be used at different time instants. For example, the first AGC unit may be connected to the antenna at a first time instant, and the second AGC unit may be connected to the same antenna at a second time instant, wherein the apparatus switches from the first AGC unit to the second AGC unit between the first time instant and the second time instant. In this example, the second AGC unit may not be connected to the antenna at the first time instant, and the first AGC unit may not be connected to the antenna at the second time instant.

The functions and/or blocks described above by means of FIG. 6 are in no absolute chronological order, and some of them may be performed in an order differing from the described one. Other functions and/or blocks may also be executed between them or within them.

Figure 7:
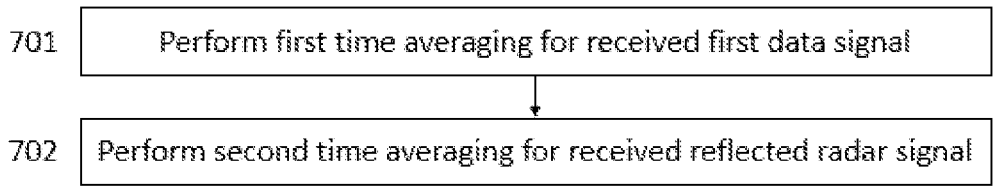

FIG. 7 illustrates a flow chart according to an exemplary embodiment. AGCs in base station receivers may perform time averaging of the received signal over a certain observation time window in order to determine and adjust the appropriate gain for proper scaling of the receiver signal power level at the ADC input. In this exemplary embodiment, a separate time averaging for time-multiplexed radar and communication signals may be carried out, and thus also different gains for radar and communication signals may be used to operate the ADC with optimized input power levels for each case. Gain adjustment may be disabled during time domain symbols in which no receive signals are expected, for example time domain symbols during which no uplink data is scheduled. Referring to FIG. 7, a first time averaging is performed 701 for a received first data signal over a first time window, and a second time averaging is performed 702 for a received reflected radar signal over a second time window. For example, the first time averaging may be performed by the first AGC unit of FIG. 6 in order to adapt the first AGC unit for data signals, and the second time averaging may be performed by the second AGC unit of FIG. 6 in order to adapt the second AGC unit for radar signals.

Figure 8A:
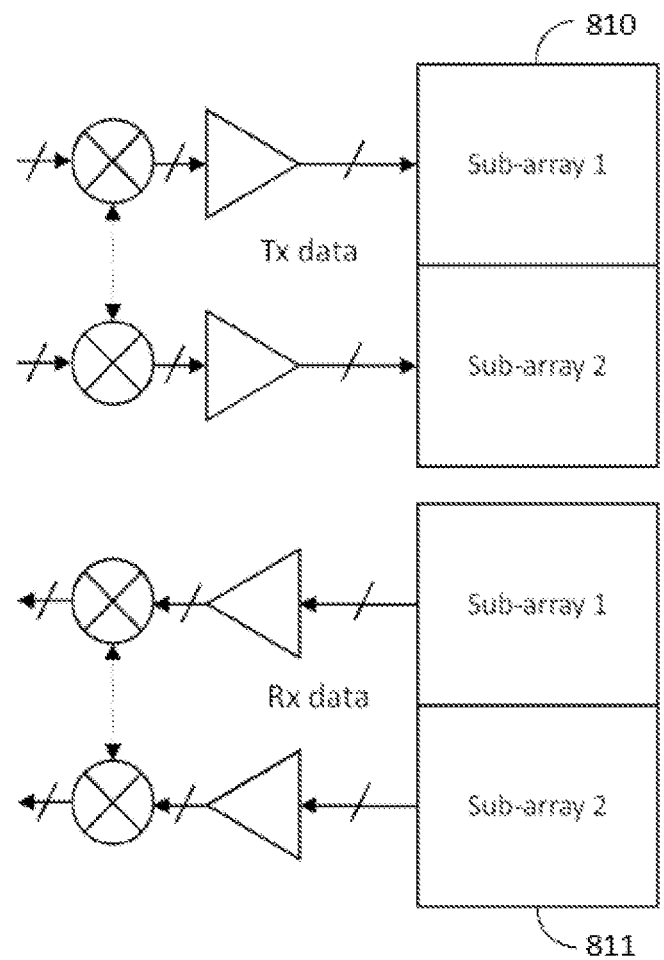
FIGS. 8a and 8b illustrate an antenna array architecture according to an exemplary embodiment.
Figure 8B:
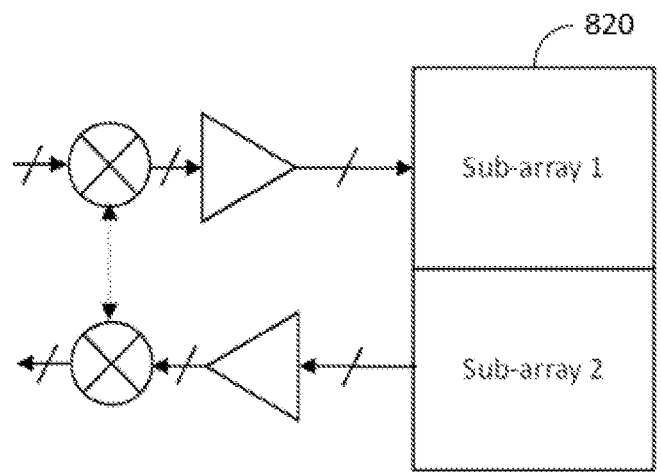

A further aspect concerns the antenna array architecture if antenna separation is required to support simultaneous transmission of the radar excitation signals and reception of the reflected radar signals. FIGS. 8a and 8b illustrate an antenna array architecture according to an exemplary embodiment. It should be noted that FIGS. 8a and 8b illustrate the same antenna array in different operating modes. FIG. 8a illustrates an antenna array architecture, wherein data transmission or reception takes place with full array gain. In other words, the antenna array may be used for a data TX mode 810 and data RX mode 811 for example by applying TDD, wherein data TX and data RX occur at different time instants. The antenna array may comprise a first subarray and a second subarray. Both of the subarrays may be used for data TX in the data TX mode 810, and both of the subarrays may be used for data RX in the data RX mode 811.

FIG. 8b illustrates an antenna array architecture, wherein the antenna array 820, i.e. the same antenna array as in FIG. 8a, is partitioned into two separate subarrays for simultaneous TX and RX for radar processing. During the time-domain symbols used for transmission of radar excitation signals, the antenna array may be partitioned into a radar TX subarray and a radar RX subarray, wherein the subarrays may be dimensioned to have the same gain and/or number of antenna elements, while no such partitioning may be enforced for data signal transmission and reception using TDD. The partitioning of the antenna array may take place along the horizontal and/or vertical dimensions, or along the polarization dimension. This may reduce the radar link budget by approximately 6 dB, thus providing incentive to use separate AGCs for data and radar symbols. However, partitioning along the polarization dimension may have the drawback that the radar processing may not be able to utilize polarization information or polarization diversity.

With this antenna array architecture, the first AGC unit may be applied when receiving data with the full array, i.e. according to FIG. 8a, and the second AGC unit may be applied when receiving reflected radar signals with the partitioned array, i.e. according to FIG. 8b. One or more AGC units may be located in the receiver path to control the gain of the RX amplifiers. Mixers or phase shifters may be coupled to enable beam alignment.

Figure 9:
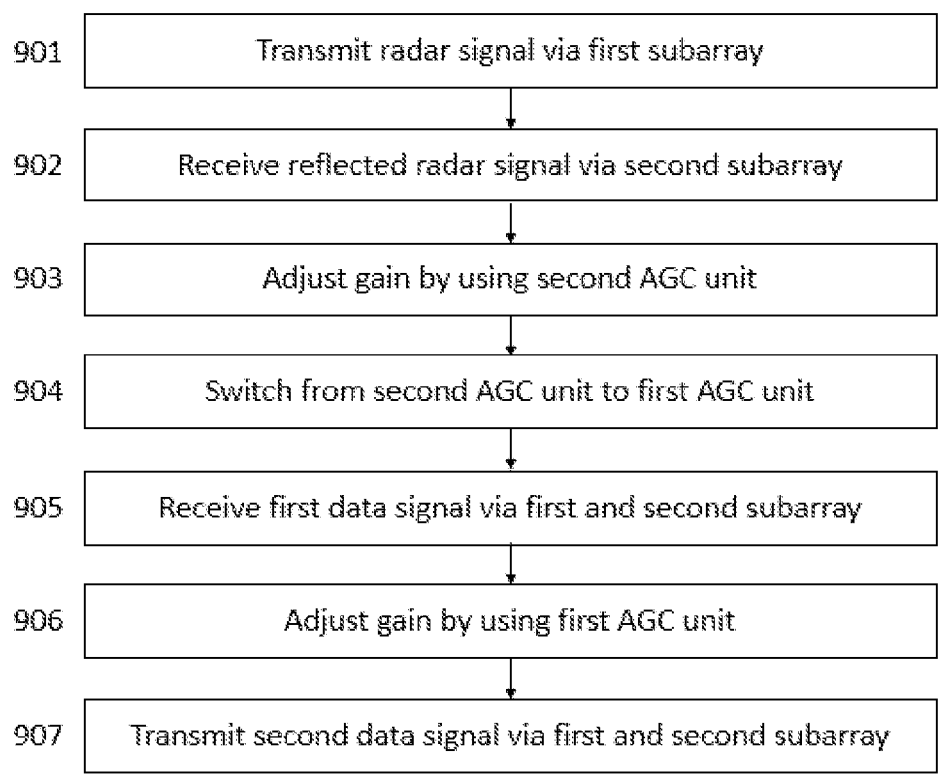
FIG. 9 illustrates a flow chart according to an exemplary embodiment.

FIG. 9 illustrates a flow chart according to an exemplary embodiment, which may use for example the antenna array architecture illustrated in FIGS. 8a and 8b. The functions illustrated in FIG. 9 may be performed for example by an apparatus such as a base station, or an RF unit comprised in a base station. Referring to FIG. 9, a radar signal is transmitted 901 via a first subarray of an antenna array, while receiving 902 the reflected radar signal via a second subarray of the antenna array. In other words, the antenna array comprises a first subarray and a second subarray, wherein the first subarray is used to transmit the radar signal, and the second subarray is used to simultaneously receive the reflected radar signal. The antenna array is connected to a second automatic gain control unit, while receiving the reflected radar signal. The second automatic gain control unit is used to adjust 903 a second amplifier gain for the received reflected radar signal. The apparatus may then switch 904 from using the second AGC unit to using a first AGC unit. A first data signal is received 905 via the antenna array, wherein the antenna array partitioning is changed such that the first subarray and the second subarray are both used to receive the first data signal. The antenna array is connected to the first automatic gain control unit, while receiving the first data signal. The first automatic gain control unit is used to adjust 906 a first amplifier gain for the received first data signal. A second data signal is transmitted 907 via the antenna array, wherein the antenna array partitioning is changed such that the first subarray and the second subarray are both used to transmit the second data signal. The second data signal may be transmitted for example to a UE.

The functions and/or blocks described above by means of FIG. 9 are in no absolute chronological order, and some of them may be performed simultaneously or in an order differing from the described one. Other functions and/or blocks may also be executed between them or within them.

Figure 10:
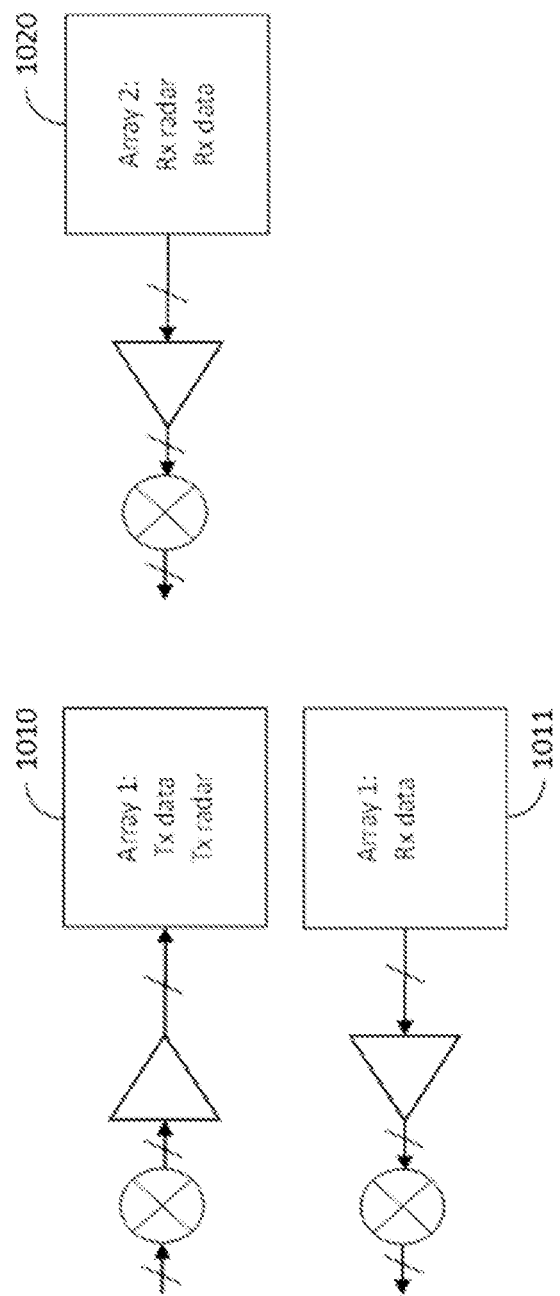
FIG. 10 illustrates an antenna array architecture according to an exemplary embodiment.

Antenna separation may also be obtained by adding a separate antenna array for receiving the reflected radar excitation signals. FIG. 10 illustrates an antenna array architecture according to an exemplary embodiment. As illustrated in FIG. 10, a first antenna array may be used for transmission 1010 of data and the radar excitation signals, as well as reception 1011 of data, all with full array gain. The first antenna array may apply for example TDD, and thus the TX and RX may occur at different time instants. A second antenna array may be used for receiving 1020 the reflected radar excitation signals with full array gain for the radar processing. The reflected radar excitation signal may be received simultaneously, while transmitting the radar excitation signal. The second antenna array may further be applied, for example in the uplink time interval, for receiving data and/or control information from the UEs to enhance data rate and/or reliability. The data signal received by the second antenna array may be the same as the data signal received by the first antenna array. The second antenna array may further be applied for receiving pilot signal(s) from UEs to enhance localization accuracy, for example to assist triangularization based on sounding reference signals. In this case, positioning based on angle or time difference methods of arrival using uplink signals from the UE may be carried out based on several reception points including the second antenna array.

With this antenna array architecture, two-state AGC may be applicable with the second antenna array 1020, as radar reflection and data or pilot/sounding symbols may have significant differences in receive power level. The second antenna array 1020 may thus be an additionally installed antenna array for example in a cellular base station, which may serve for radar reception, increase sounding-signal based localization accuracy, and boost uplink block error rate, reliability, and/or throughput performance.

Figure 11:
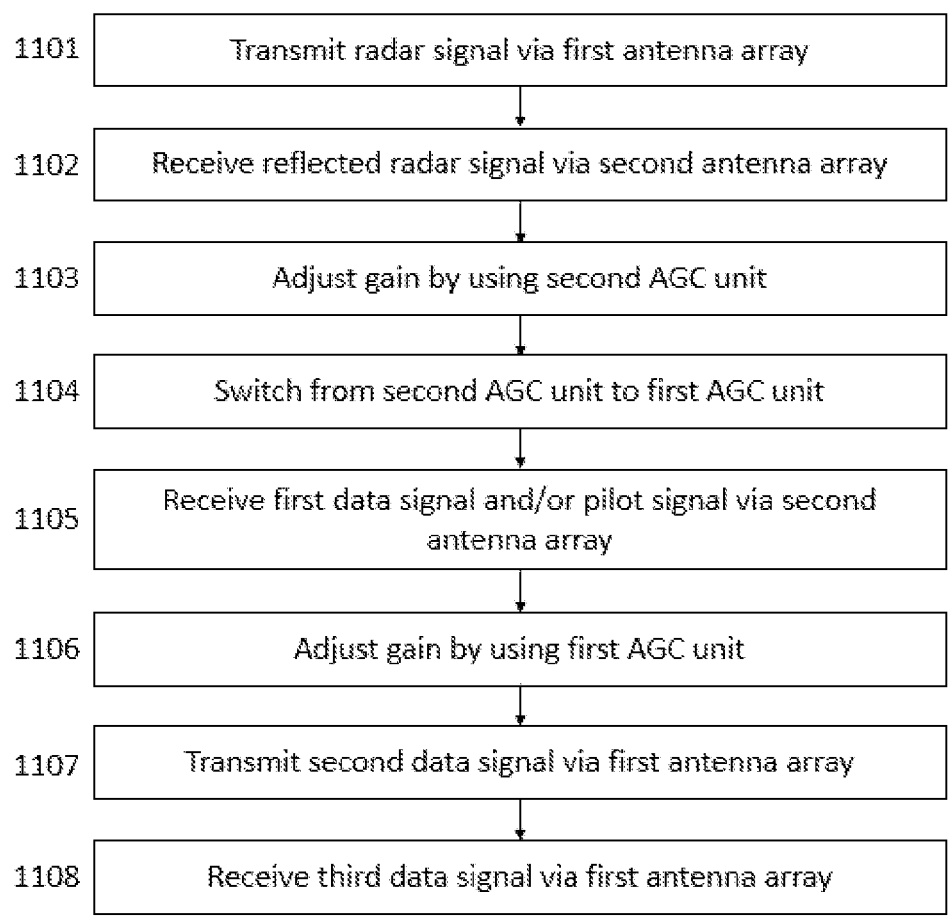

FIG. 11 illustrates a flow chart according to an exemplary embodiment, which may use for example the antenna array architecture illustrated in FIG. 10. The functions illustrated in FIG. 11 may be performed for example by an apparatus such as a base station, or an RF unit comprised in a base station. Referring to FIG. 11, a radar signal is transmitted 1101 via a first antenna array, while receiving 1102 the reflected radar signal via a second antenna array. The second antenna array is connected to a second automatic gain control unit, while receiving the reflected radar signal. The second automatic gain control unit is used to adjust 1103 a second amplifier gain for the received reflected radar signal. The apparatus may then switch 1104 from using the second AGC unit to using a first AGC unit. A first data signal and/or a pilot signal is received 1105 via the second antenna array. The second antenna array is connected to the first automatic gain control unit, while receiving the first data signal and/or the pilot signal. The first automatic gain control unit is used to adjust 1106 a first amplifier gain for the received first data signal and/or the pilot signal. A second data signal is transmitted 1107 via the first antenna array. A third data signal is received 1108 via the first antenna array. The third data signal may be the same as the first data signal, i.e. the first data signal and the third data signal may be substantially identical, or they may be different data signals. If the third data signal is the same as the first data signal, the first data signal may be received simultaneously on the first antenna array and on the second antenna array.

The functions and/or blocks described above by means of FIG. 11 are in no absolute chronological order, and some of them may be performed simultaneously or in an order differing from the described one. Other functions and/or blocks may also be executed between them or within them.

Another exemplary embodiment relates to the signalling interface between baseband, BB, and RF units, for example via a control interface such as a serial peripheral interface, SPI, or inband via a data interface such as a common public radio interface, CPRI, or reference point 3, RP3, of open base station architecture initiative, OBSAI. AGC state information and/or antenna array partitioning state information may be carried on the DL BB-to-RF interface. For example, the AGC state information and/or the antenna array partitioning state information may be carried on enhanced CPRI, eCPRI, message type #2 real-time control data, which may be used for example to transfer vendor-specific real-time control messages between physical, PHY, processing elements split between eCPRI nodes, for example eCPRI radio equipment control, eREC, and eCPRI radio equipment, eRE. This message type may address the need to exchange various types of control information associated with user data for example in the form of IQ samples, bit sequence, etc., between eCPRI nodes in real-time for control, configuration, and/or measurement.

If radar excitation signals are transmitted on a DL time domain symbol, the signals simultaneously received on the UL may need to be fed into the radar processing, and the antenna array may need to be partitioned as illustrated in FIG. 8b. In other words, the AGC state information signalled on the DL BB-to-RF interface implicitly indicates whether the transmit signal is used for radar excitation or not. The time granularity for that signalling may need to be sufficiently fine to distinguish between different time domain symbols of the air interface, such as OFDM symbols. For example, the granularity may correspond to the sampling time, or a fraction thereof. The timing relationship may be established by hardware means or with time stamps prior to the actual data transfer.

Antenna array partitioning state information may also be signalled on the DL BB-to-RF interface. The antenna array partitioning state information indicates at least whether a first subarray is used for transmitting or receiving and whether a second subarray is used for transmitting or receiving, wherein the first subarray and the second subarray are comprised in the same antenna array. For example, the antenna array partitioning state information may indicate that a first subarray is used for TX and a second subarray is used for RX. The antenna array partitioning state information may also comprise information concerning how such splitting shall be done. If the antenna array is partitioned into two or more subarrays, each subarray may be assigned a subarray index, and the antenna array partitioning state information may indicate that a first subset of subarrays characterized by a first list of subarray indices is used for TX and a second subset of subarrays characterized by a second list of subarray indices is used for RX. The antenna array partitioning may be time-variant, which may enable for example a kind of synthetic aperture radar. AGC state information may also be derived implicitly from the antenna array partitioning state information.

FIG. 12 illustrates a flow chart according to an exemplary embodiment. The functions illustrated in FIG. 12 may be performed for example by a baseband unit comprised in a base station. Referring to FIG. 12, automatic gain control state information and/or antenna array partitioning state information is transmitted 1201 from a baseband unit to a radio frequency unit via an interface between the baseband unit and the radio frequency unit. The automatic gain control state information indicates whether a received signal is used for radar or not, i.e. whether the received signal is a reflected radar signal or not, and/or a state change for switching between using a first automatic gain control unit and using a second automatic gain control unit. The antenna array partitioning state information indicates at least whether a first subarray is used for transmitting or receiving and whether a second subarray is used for transmitting or receiving.

FIG. 13 illustrates a flow chart according to an exemplary embodiment. The functions illustrated in FIG. 13 may be performed for example by an RF unit comprised in a base station. Referring to FIG. 13, automatic gain control state information and/or antenna array partitioning state information is received 1301 from a baseband unit to a radio frequency unit via an interface between the baseband unit and the radio frequency unit. The automatic gain control state information indicates whether a received signal is used for radar or not, i.e. whether the received signal is a reflected radar signal or not, and/or a state change for switching between using a first automatic gain control unit and using a second automatic gain control unit. The antenna array partitioning state information indicates at least whether a first subarray is used for transmitting or receiving and whether a second subarray is used for transmitting or receiving. Upon receiving automatic gain control state information, the radio frequency unit may then switch 1302 between using the first automatic gain control unit and using the second automatic gain control unit based at least partly on the received automatic gain control state information. For example, if the automatic gain control state information indicates that the received signal is used for radar, the second automatic gain control unit is used to receive the reflected radar signal. On the other hand, if the automatic gain control state information indicates that the received signal is not used for radar, the first automatic gain control unit may be used to receive a data signal. Upon receiving the antenna array partitioning state information, the first subarray and the second subarray may be used 1303 for transmitting or receiving based at least partly on the received antenna array partitioning state information. The first subarray and the second subarray may be comprised in an antenna array connected to the radio frequency unit, and to the first automatic gain control unit or to the second automatic gain control unit. For example, if the antenna array partitioning state information indicates that the second subarray is used for receiving and the first subarray is used for transmitting, then the reflected radar signal or the data signal may be received via the second subarray.

Figure 14B:
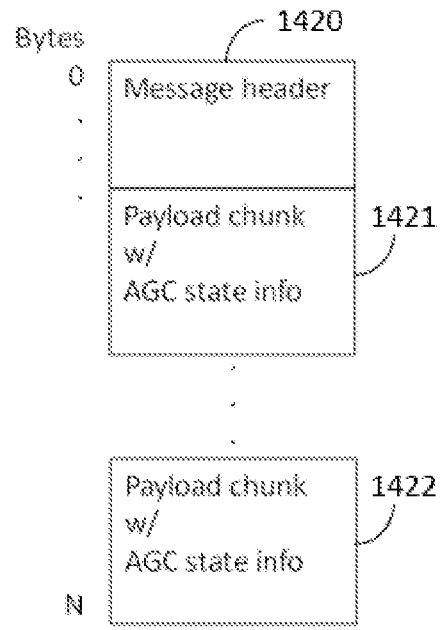
Figure 14C:
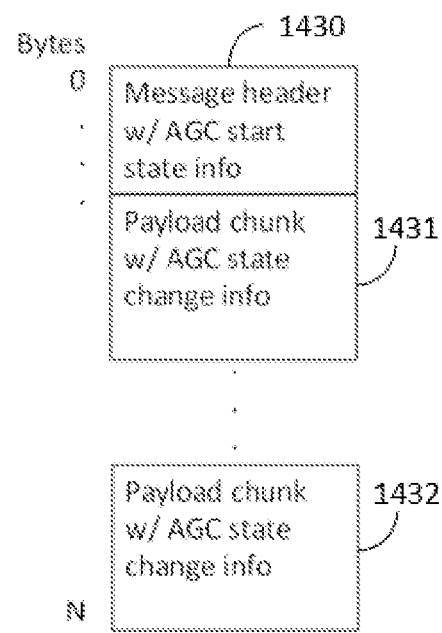

FIGS. 14a, 14b and 14c illustrate message formats according to some exemplary embodiments for carrying AGC state information and/or antenna array partitioning state information as inband signalling on CPRI user plane. The message comprises a message header 1410, 1420, 1430 and payload chunks 1411, 1412, 1421, 1422, 1431, 1432, wherein the payload chunks may be synchronized with the time-domain symbol timing. In FIG. 14a, the AGC state is carried in the message header 1410 and may apply to the time duration represented by the message payload 1411, 1412, for example if the payload carried by the message corresponds to the samples transmitted during a time domain symbol. Alternatively, the AGC state may be signalled individually per payload chunk 1421, 1422 as illustrated in FIG. 14b, for example if each payload chunk corresponds to the samples transmitted during a time domain symbol. Alternatively, the payload chunks may not be synchronized with the time-domain symbol timing. In this case, the AGC state transitions may need to be signalled, for example by means of an AGC start state and by a set of time stamps, each time stamp indicating an AGC state change, as illustrated in FIG. 14c.

The signalling of binary AGC state may be extended by adding information to the respective AGC on whether it shall enable or disable the gain adjustment. Gain adjustment may be disabled for example during time domain symbols, in which no uplink data is scheduled. In this case, the AGC may operate with fixed pre-adjusted gain, for example to receive non-scheduled random access signals.

In another exemplary embodiment, AGC state information may be used for other purposes, such as to adapt the transmit power amplifier operation point, for example to give a power boost to radar signals. The subset of time domain symbols used for radar excitation may carry signals with reduced peak to average power ratio, PAPR, such as a chirp signal with FMCW radar or a Zadoff-Chu, ZC, sequence with OFDM radar, and therefore those symbols may be transmitted with higher power.

In some exemplary embodiments, the message formats illustrated in FIGS. 14a, 14b and 14c may be used for carrying antenna array partitioning state information instead of or in addition to the AGC state information.

Radio heads may be multi-channel/multi-band, and implemented with multiple licensed bands and/or a combination of licensed and unlicensed bands simultaneously. With such radio heads, both channels/bands may be used at different times for communication and sensing. In such a scheme, although there may be separate AGCs for each channel/band, the AGC setting between sensing and communication for appropriate AGC states may be shared across the two channels/bands allowing more rapid convergence of AGC. If AGCs are implemented by means of different hardware instances, there may be an AGC for each channel/band for supporting communications, and a reduced number of AGCs for supporting the radar sensing. For example, with dual-channel/band there may be three AGC hardware instances, i.e. two for communication and one for radar.

The multi-band nature of the radio head may also allow for radar processing across several frequencies. For example, the estimation of range and Doppler shift may be computed from measurements on two different frequencies, denoted as $f_1$ and $f_2$. FMCW radar may have the property that the beat frequency $f_B$, i.e. the frequency of the receive signal after down-mixing with the instantaneous TX frequency, is a function of range and velocity according to:

$$f_B = -R2B/(cT_c) + 2/\lambda v$$

where R denotes the target range, B the signal bandwidth, c the velocity of light, $T_c$ the duration of a single chirp, $\lambda$ the wavelength, i.e. $\lambda = c/f$, and v the velocity of the target.

By measuring the beat frequencies $f_{B1}$ and $f_{B2}$ on frequencies $f_1$ and $f_2$, the velocity v may be computed from the difference $f_{B1} - f_{B2} = 2$ v/c $(f_1 - f_2)$. In other words, the ambiguity of FMCW radar may be resolved faster within $1T_c$. In this way, the time to complete a full beam sweep may be reduced by the number of bands. An alternative solution to reduce the beam sweep time may be to partition the beam space between the bands.

Figure 15:
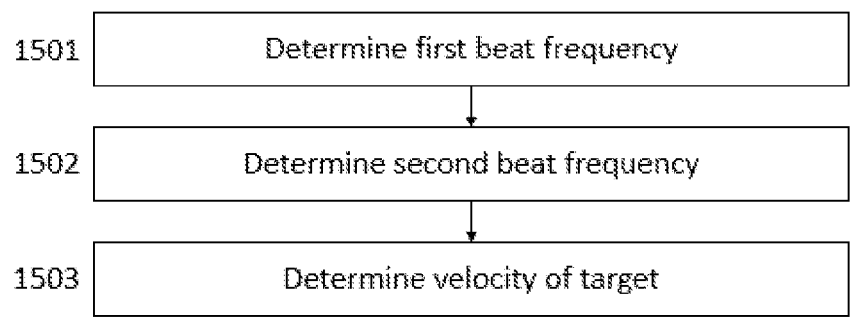
FIG. 15 illustrates a flow chart according to an exemplary embodiment.

FIG. 15 illustrates a flow chart according to an exemplary embodiment. A first beat frequency is determined 1501 based at least partly on a first carrier frequency of a received reflected radar signal. A second beat frequency is determined 1502 based at least partly on a second carrier frequency of the received reflected radar signal. A velocity of a target is determined 1503 based at least partly on the first beat frequency and the second beat frequency. The target may be any object, such as a car or a human.

A technical advantage provided by some exemplary embodiments may be that they may improve the performance of communication and radar, as well as enable interoperation of BB and RF units. For example in cross-vendor solutions, the AGC states may explicitly define the context, such as usage of FMCW radar. Some exemplary embodiments may be applicable to base stations as well as terminal devices performing simultaneous uplink communication to the base station and local sensing using radar signals.

Figure 16:
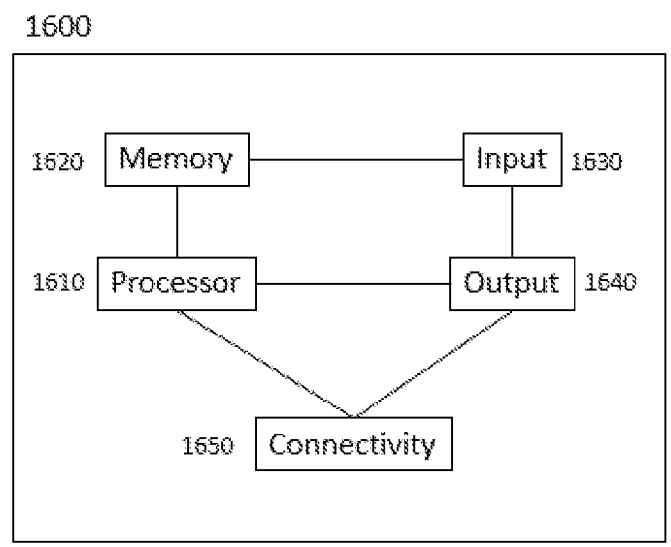
FIGS. 16 and 17 illustrate apparatuses according to exemplary embodiments.

FIG. 16 illustrates an apparatus 1600, which may be an apparatus such as, or comprised in, a terminal device, according to an exemplary embodiment. The terminal device may also be referred to as a UE. The apparatus 1600 comprises a processor 1610. The processor 1610 interprets computer program instructions and processes data. The processor 1610 may comprise one or more programmable processors. The processor 1610 may comprise programmable hardware with embedded firmware and may, alternatively or additionally, comprise one or more application specific integrated circuits, ASICs.

The processor 1610 is coupled to a memory 1620. The processor is configured to read and write data to and from the memory 1620. The memory 1620 may comprise one or more memory units. The memory units may be volatile or non-volatile. It is to be noted that in some exemplary embodiments there may be one or more units of non-volatile memory and one or more units of volatile memory or, alternatively, one or more units of non-volatile memory, or, alternatively, one or more units of volatile memory. Volatile memory may be for example RAM, DRAM or SDRAM. Non-volatile memory may be for example ROM, PROM, EEPROM, flash memory, optical storage or magnetic storage. In general, memories may be referred to as non-transitory computer readable media. The memory 1620 stores computer readable instructions that are executed by the processor 1610. For example, non-volatile memory stores the computer readable instructions and the processor 1610 executes the instructions using volatile memory for temporary storage of data and/or instructions.

The computer readable instructions may have been pre-stored to the memory 1620 or, alternatively or additionally, they may be received, by the apparatus, via an electromagnetic carrier signal and/or may be copied from a physical entity such as a computer program product. Execution of the computer readable instructions causes the apparatus 1600 to perform one or more of the functionalities described above.

In the context of this document, a "memory" or "computer-readable media" or "computer-readable medium" may be any non-transitory media or medium or means that can contain, store, communicate, propagate or transport the instructions for use by or in connection with an instruction execution system, apparatus, or device, such as a computer.

The apparatus 1600 may further comprise, or be connected to, an input unit 1630. The input unit 1630 may comprise one or more interfaces for receiving input. The one or more interfaces may comprise for example one or more temperature, motion and/or orientation sensors, one or more cameras, one or more accelerometers, one or more microphones, one or more buttons and/or one or more touch detection units. Further, the input unit 1630 may comprise an interface to which external devices may connect to.

The apparatus 1600 may also comprise an output unit 1640. The output unit may comprise or be connected to one or more displays capable of rendering visual content such as a light emitting diode, LED, display, a liquid crystal display, LCD and a liquid crystal on silicon, LCoS, display. The output unit 1640 may further comprise one or more audio outputs. The one or more audio outputs may be for example loudspeakers.

The apparatus 1600 further comprises a connectivity unit 1650. The connectivity unit 1650 enables wireless connectivity to one or more external devices. The connectivity unit 1650 comprises at least one transmitter and at least one receiver that may be integrated to the apparatus 1600 or that the apparatus 1600 may be connected to. The at least one transmitter comprises at least one transmission antenna, and the at least one receiver comprises at least one receiving antenna. The connectivity unit 1650 may comprise an integrated circuit or a set of integrated circuits that provide the wireless communication capability for the apparatus 1600.

Alternatively, the wireless connectivity may be a hardwired application specific integrated circuit, ASIC. The connectivity unit 1650 may comprise one or more components such as a power amplifier, digital front end, DFE, analog-to-digital converter, ADC, digital-to-analog converter, DAC, frequency converter, (de)modulator, and/or encoder/decoder circuitries, controlled by the corresponding controlling units.

It is to be noted that the apparatus 1600 may further comprise various components not illustrated in FIG. 16. The various components may be hardware components and/or software components.

Figure 17:
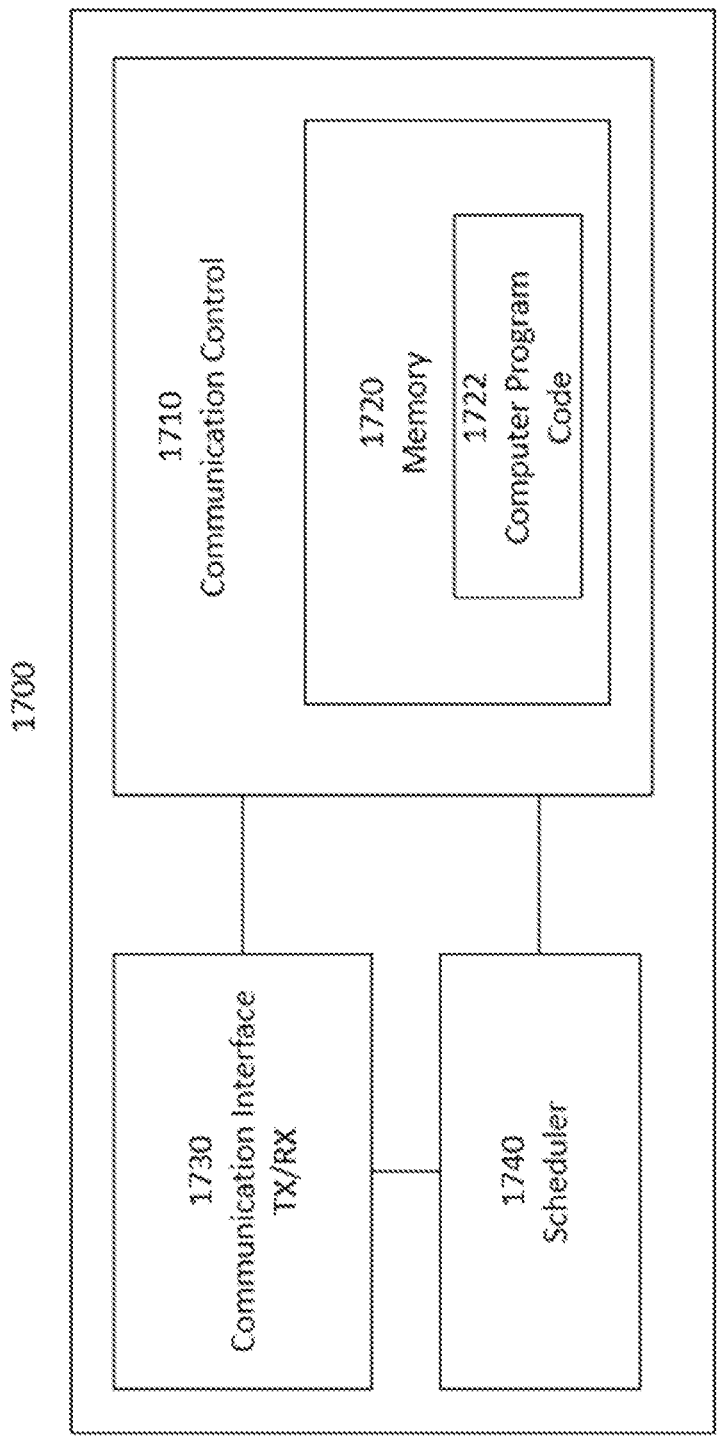

The apparatus 1700 of FIG. 17 illustrates an exemplary embodiment of an apparatus such as, or comprised in, a base station such as a gNB. The apparatus may comprise, for example, a circuitry or a chipset applicable to a base station to realize some of the described exemplary embodiments. The apparatus 1700 may be an electronic device comprising one or more electronic circuitries. The apparatus 1700 may comprise a communication control circuitry 1710 such as at least one processor, and at least one memory 1720 including a computer program code (software) 1722 wherein the at least one memory and the computer program code (software) 1722 are configured, with the at least one processor, to cause the apparatus 1700 to carry out some of the exemplary embodiments described above.

The memory 1720 may be implemented using any suitable data storage technology, such as semiconductor-based memory devices, flash memory, magnetic memory devices and systems, optical memory devices and systems, fixed memory and removable memory. The memory may comprise a configuration database for storing configuration data. For example, the configuration database may store a current neighbour cell list, and, in some exemplary embodiments, structures of the frames used in the detected neighbour cells.

The apparatus 1700 may further comprise a communication interface 1730 comprising hardware and/or software for realizing communication connectivity according to one or more communication protocols. The communication interface 1730 may provide the apparatus with radio communication capabilities to communicate in the cellular communication system. The communication interface may, for example, provide a radio interface to terminal devices. The apparatus 1700 may further comprise another interface towards a core network such as the network coordinator apparatus and/or to the access nodes of the cellular communication system. The apparatus 1700 may further comprise a scheduler 1740 that is configured to allocate resources.

Figure 18:
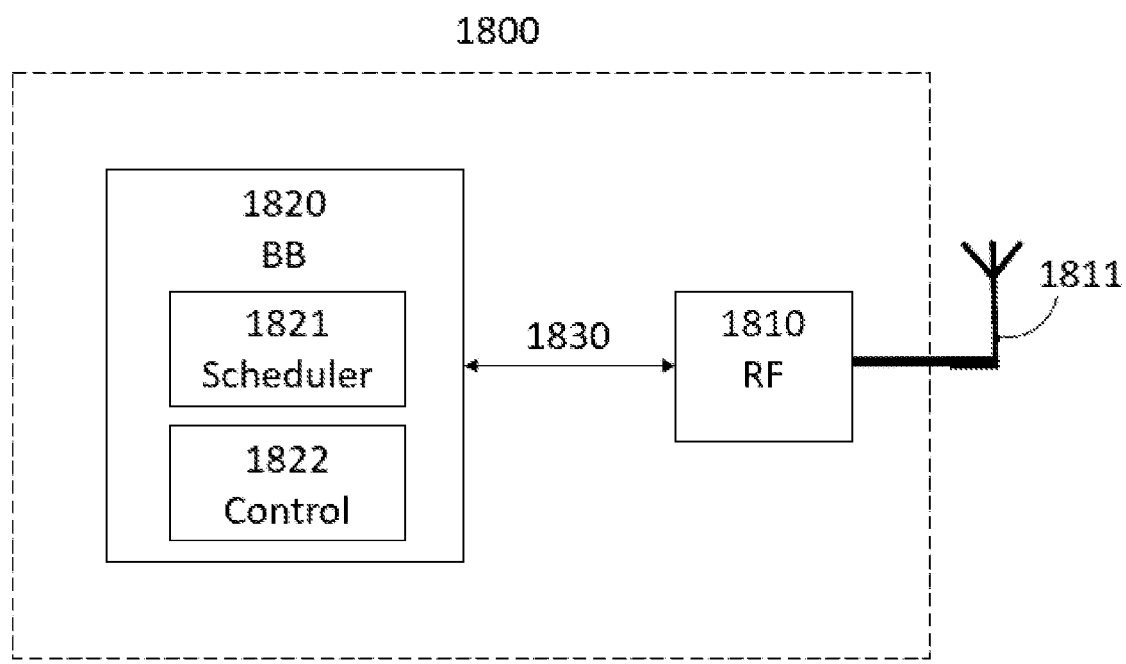
FIG. 18 illustrates an exemplary embodiment of a base station.

FIG. 18 illustrates a simplified exemplary embodiment of a base station 1800 in relation to the exemplary embodiments described above. It is obvious for a person skilled in the art that the base station may deviate from what is depicted in FIG. 18. The base station comprises an RF unit 1810, which may also be referred to as a radio head. The RF unit may, for example, provide capabilities for radar sensing and/or radio communication with one or more terminal devices. The RF unit may be common for both a receiver and a transmitter of the base station. The transmitter and receiver may also be separate components. The RF unit may also comprise a low noise amplifier, which amplifies a received signal that has been attenuated in a radio path. A receiver may down-convert the received signal to an intermediate frequency and then to a baseband frequency, or directly to the baseband frequency. In a transmitter, the signal may be up-converted to a carrier frequency and be amplified with a transmit power amplifier. The RF unit may also comprise an analog-to-digital and/or digital-to-analog converter. The RF unit may further comprise one or more AGC units to carry out some of the exemplary embodiments described above. The RF unit may be connected to one or more antennas 1811. The transceiver may use the same antenna for receiving and transmitting, and therefore there may also be a duplex filter to separate transmission and reception. Separate antennas may also be used for transmission and reception. The antenna may be an antenna array or a single antenna. Various other radio frequency functionalities, such as modulating/demodulating and error correction may be comprised in the RF unit.

In the exemplary embodiment of FIG. 18, additional functions of the base station are comprised in a baseband, BB, unit 1820 that may be used for processing baseband. The BB unit and the RF unit are connected via an interface 1830. The interface may be, for example, a control interface such as SPI or a data interface such as CPRI, or RP3 of OBSAI. The BB unit may be implemented, for example, as an ASIC (application specific integrated circuit) component. The BB unit may perform, for example, digital signal processing (DSP) functions, like coding and decoding, if required. Also modulation and de-modulation may be performed in the BB unit. The BB unit may comprise a DSP block for DSP processing and/or a CPU block (central processing unit). The BB unit may further comprise a memory unit or be connected to a memory unit. The memory may be implemented using any suitable data storage technology, such as semiconductor-based memory devices, flash memory, magnetic memory devices and systems, optical memory devices and systems, fixed memory and removable memory. In other words, the BB unit may comprise at least one processor, and at least one memory including a computer program code (software), wherein the at least one memory and the computer program code (software) are configured, with the at least one processor, to cause the base station to carry out some of the exemplary embodiments described above.

In this exemplary embodiment, the BB unit comprises a scheduler 1821 that is configured to schedule the transmission of radar and/or data signals. AGC state information and/or antenna array partitioning state information originating from the scheduler 1821 may be transmitted to the RF unit 1810. The control block 1822 that, in this exemplary embodiment, is comprised in the BB unit, may carry out controlling of transmission and reception of radar and/or data signals.

As used in this application, the term "circuitry" may refer to one or more or all of the following:

a. hardware-only circuit implementations (such as implementations in only analog and/or digital circuitry) and b. combinations of hardware circuits and software, such as (as applicable):
  i. a combination of analog and/or digital hardware circuit(s) with software/firmware and
  ii. any portions of hardware processor(s) with software (including digital signal processor(s)), software, and memory(ies) that work together to cause an apparatus, such as a mobile phone, to perform various functions) and c. hardware circuit(s) and or processor(s), such as a microprocessor(s) or a portion of a microprocessor(s), that requires software (for example firmware) for operation, but the software may not be present when it is not needed for operation.

This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

The techniques and methods described herein may be implemented by various means. For example, these techniques may be implemented in hardware (one or more devices), firmware (one or more devices), software (one or more modules), or combinations thereof. For a hardware implementation, the apparatus(es) of exemplary embodiments may be implemented within one or more application-specific integrated circuits (ASICs), digital signal processors (DSPs), digital signal processing devices (DSPDs), programmable logic devices (PLDs), field programmable gate arrays (FPGAs), graphics processing units (GPUs), processors, controllers, micro-controllers, microprocessors, other electronic units designed to perform the functions described herein, or a combination thereof. For firmware or software, the implementation can be carried out through modules of at least one chipset (e.g. procedures, functions, and so on) that perform the functions described herein. The software codes may be stored in a memory unit and executed by processors. The memory unit may be implemented within the processor or externally to the processor. In the latter case, it can be communicatively coupled to the processor via various means, as is known in the art. Additionally, the components of the systems described herein may be rearranged and/or complemented by additional components in order to facilitate the achievements of the various aspects, etc., described with regard thereto, and they are not limited to the precise configurations set forth in the given figures, as will be appreciated by one skilled in the art.

It will be obvious to a person skilled in the art that, as technology advances, the inventive concept may be implemented in various ways. The embodiments are not limited to the exemplary embodiments described above, but may vary within the scope of the claims. Therefore, all words and expressions should be interpreted broadly, and they are intended to illustrate, not to restrict, the exemplary embodiments.

The invention claimed is:

1. An apparatus, comprising:
    at least one processor; and
    at least one memory including computer program code, wherein the at least one memory and the computer program code are configured, with the at least one processor, to cause the apparatus to:
    transmit a radar signal via a first antenna array, while receiving a reflected radar signal via a second antenna array;
    receive a first data signal or a pilot signal via the second antenna array;
    use a first automatic gain control unit to receive the first data signal, wherein the second antenna array is connected to the first automatic gain control unit, while receiving the first data signal or the pilot signal;
    use a second automatic gain control unit to receive the reflected radar signal, wherein the second antenna array is connected to the second automatic gain control unit, while receiving the reflected radar signal;
    switch between using the first automatic gain control unit and using the second automatic gain control unit.

2. The apparatus according to claim 1, wherein the apparatus is further caused to:
    transmit a second data signal via the first antenna array;
    receive a third data signal via the first antenna array.

3. The apparatus according to claim 1, wherein the received first data signal and the received reflected radar signal use a substantially same carrier frequency.

4. The apparatus according to claim 1, wherein the apparatus is further caused to perform a first time averaging for the received first data signal and a second time averaging for the received reflected radar signal.

5. The apparatus according to claim 1, wherein the apparatus is further caused to:
    determine a first beat frequency based at least partly on a first carrier frequency of the received reflected radar signal;
    determine a second beat frequency based at least partly on a second carrier frequency of the received reflected radar signal;
    determine a velocity of a target based at least partly on the first beat frequency and the second beat frequency.

6. The apparatus according to claim 1, wherein the apparatus is further caused to:
    receive automatic gain control state information, wherein the automatic gain control state information indicates whether a received signal is the reflected radar signal or not, or a state change for switching between using the first automatic gain control unit and using the second automatic gain control unit.

7. The apparatus according to claim 6, wherein the automatic gain control state information is configured to adapt a power amplifier operation point or to indicate whether to enable or disable a gain adjustment in the first automatic gain control unit or in the second automatic gain control unit.

8. An apparatus, comprising:
    at least one processor; and
    at least one memory including computer program code, wherein the at least one memory and the computer program code are configured, with the at least one processor, to cause the apparatus to:
    transmit a radar signal via a first antenna array, while receiving a reflected radar signal via the first antenna array, wherein the first antenna array comprises a first subarray and a second subarray, wherein the first subarray is used to transmit the radar signal, and wherein the second subarray is used to receive the reflected radar signal;
    receive a first data signal via the first antenna array, wherein the first subarray and the second subarray are used to receive the first data signal;
    use a first automatic gain control unit to receive the first data signal, wherein the first antenna array is connected to the first automatic gain control unit, while receiving the first data signal;
    use a second automatic gain control unit to receive the reflected radar signal, wherein the first antenna array is connected to the second automatic gain control unit, while receiving the reflected radar signal;
    switch between using the first automatic gain control unit and using the second automatic gain control unit.

9. The apparatus according to claim 8, wherein the apparatus is further caused to:
    transmit a second data signal via the first antenna array, wherein the first subarray and the second subarray are used to transmit the second data signal.

10. The apparatus according to claim 8, wherein the apparatus is further caused to:
receive antenna array partitioning state information, wherein the antenna array partitioning state information indicates at least whether the first subarray is used for transmitting or receiving, and whether the second subarray is used for transmitting or receiving.

11. The apparatus according to claim 8, wherein the received first data signal and the received reflected radar signal use a substantially same carrier frequency.

12. The apparatus according to claim 8, wherein the apparatus is further caused to perform a first time averaging for the received first data signal and a second time averaging for the received reflected radar signal.

13. The apparatus according to claim 8, wherein the apparatus is further caused to:
determine a first beat frequency based at least partly on a first carrier frequency of the received reflected radar signal;
determine a second beat frequency based at least partly on a second carrier frequency of the received reflected radar signal;
determine a velocity of a target based at least partly on the first beat frequency and the second beat frequency.

14. The apparatus according to claim 8, wherein the apparatus is further caused to:
receive automatic gain control state information, wherein the automatic gain control state information indicates whether a received signal is the reflected radar signal or not, or a state change for switching between using the first automatic gain control unit and using the second automatic gain control unit.

15. The apparatus according to claim 14, wherein the automatic gain control state information is configured to adapt a power amplifier operation point or to indicate whether to enable or disable a gain adjustment in the first automatic gain control unit or in the second automatic gain control unit.

16. A method, comprising:
transmitting a radar signal via a first antenna array, while receiving a reflected radar signal via a second antenna array;
receiving a first data signal or a pilot signal via the second antenna array;
using a first automatic gain control unit to receive the first data signal, wherein the second antenna array is connected to the first automatic gain control unit, while receiving the first data signal or the pilot signal;
using a second automatic gain control unit to receive the reflected radar signal, wherein the second antenna array is connected to the second automatic gain control unit, while receiving the reflected radar signal;
switching between using the first automatic gain control unit and using the second automatic gain control unit.

17. The method according to claim 16, further comprising:
transmitting a second data signal via the first antenna array;
receiving a third data signal via the first antenna array.

18. The method according to claim 16, wherein the received first data signal and the received reflected radar signal use a substantially same carrier frequency.

19. The method according to claim 16, further comprising:
performing a first time averaging for the received first data signal and a second time averaging for the received reflected radar signal.

20. The method according to claim 16, further comprising:
determining a first beat frequency based at least partly on a first carrier frequency of the received reflected radar signal;
determining a second beat frequency based at least partly on a second carrier frequency of the received reflected radar signal; and
determining a velocity of a target based at least partly on the first beat frequency and the second beat frequency.

* * * * *